US010551418B2

(12) United States Patent
Malrait et al.

(10) Patent No.: US 10,551,418 B2
(45) Date of Patent: Feb. 4, 2020

(54) METHOD FOR IDENTIFYING THE ELECTRICAL RESISTANCE OF THE ROTOR OF AN ELECTRIC MOTOR

(71) Applicant: Schneider Toshiba Inverter Europe SAS, Pacy sur Eure (FR)

(72) Inventors: Francois Malrait, Jouy sur Eure (FR); Thomas Devos, Carrieres sous Poissy (FR); Al Kassem Jebai, Vernon (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 0 days.

(21) Appl. No.: 15/958,031

(22) Filed: Apr. 20, 2018

(65) Prior Publication Data

US 2018/0328969 A1 Nov. 15, 2018

(30) Foreign Application Priority Data

May 10, 2017 (FR) ...................... 17 54076

(51) Int. Cl.
*G01R 27/14* (2006.01)
*G01R 31/34* (2020.01)
(Continued)

(52) U.S. Cl.
CPC ............ *G01R 27/14* (2013.01); *G01R 31/343* (2013.01); *H02P 21/14* (2013.01); *H02P 23/0077* (2013.01); *H02P 23/14* (2013.01)

(58) Field of Classification Search
CPC .......... G01R 27/14; H02P 21/14; H02P 23/14
(Continued)

(56) References Cited

U.S. PATENT DOCUMENTS 4,670,698 A * 6/1987 Fulton ................. G01R 31/343
318/802
5,170,116 A * 12/1992 Bavard ................. H02P 21/141
318/798

(Continued)

OTHER PUBLICATIONS

French Preliminary Search Report dated Feb. 9, 2018 in French Application 17 54076, filed on May 10, 2017 (with English Translation of Categories of cited documents & Written Opinion).

(Continued)

*Primary Examiner* — Kawing Chan
(74) *Attorney, Agent, or Firm* — Oblon, McClelland, Maier & Neustadt, L.L.P.

(57) ABSTRACT

A method for identifying a resistance value ($R_r$) of the rotor of an electric induction motor (M), including determining a reference voltage ($u^{ref}_s$) on the basis of a chosen value ($\hat{R}_r$) for the resistance of the rotor of the electric motor, applying a control voltage ($u_s$) to the electric motor, the control voltage being determined on the basis of the reference voltage ($u^{ref}_s$), acquiring the values of the currents ($i_1$, $i_2$, $i_3$) measured in the three phases of the electric motor, so as to deduce a stator current ($i_S$) of the electric motor therefrom, comparing the obtained stator current ($i_S$) with a predetermined value ($i^{ref}_S$), correcting the value ($\hat{R}_r$) used for the resistance ($R_r$) of the rotor and applying steps a) to d) until obtaining a stator current ($i_S$) equal to the predetermined value.

9 Claims, 2 Drawing Sheets

(51) Int. Cl.
*H02P 21/14* (2016.01)
*H02P 23/00* (2016.01)
*H02P 23/14* (2006.01)

(58) Field of Classification Search
USPC .......................................................... 318/727
See application file for complete search history.

(56) References Cited

U.S. PATENT DOCUMENTS

| | | | | |
|---|---|---|---|---|
| 7,202,629 | B2* | 4/2007 | Jadot | H02P 21/16 |
| | | | | 318/432 |
| 7,412,339 | B2* | 8/2008 | Ramu | H02P 25/089 |
| | | | | 318/484 |
| 7,560,895 | B2* | 7/2009 | Arnet | H02P 21/09 |
| | | | | 318/723 |
| 7,825,620 | B2* | 11/2010 | Nakatsugawa | H02P 21/06 |
| | | | | 318/490 |
| 9,692,340 | B2* | 6/2017 | Laursen | H02P 21/0003 |
| 2008/0129243 | A1* | 6/2008 | Nashiki | H02K 1/145 |
| | | | | 318/701 |
| 2012/0123715 | A1* | 5/2012 | Eskola | G01R 31/34 |
| | | | | 702/65 |
| 2013/0173193 | A1* | 7/2013 | Yan | G01R 31/34 |
| | | | | 702/66 |
| 2014/0132200 | A1 | 5/2014 | Yoo | |
| 2015/0177328 | A1 | 6/2015 | Harke | |
| 2015/0372627 | A1* | 12/2015 | Kim | H02P 21/141 |
| | | | | 318/801 |
| 2017/0104432 | A1 | 4/2017 | Jebai et al. | |

OTHER PUBLICATIONS

Diab, A., et al. "Parallel Estimation of Rotor Resistance and Speed for Sensorless Vector Controlled Induction Motor Drive", 17$^{th}$ International Conference of Young Specialists on Micro/Nanotechnologies and Electron Devices (EDM), IEEE, 2016, pp. 389-394.

Zaky, M., et al. "Sensorless Torque/Speed Control of Induction Motor Drives at Zero and Low Frequencies With Stator and Rotor Resistance Estimations", IEEE Journal of Emerging and Selected Topics in Power Electronics, 2016, pp. 1416-1429.

* cited by examiner

METHOD FOR IDENTIFYING THE ELECTRICAL RESISTANCE OF THE ROTOR OF AN ELECTRIC MOTOR

TECHNICAL FIELD OF THE INVENTION

The present invention pertains to a method for identifying the electrical resistance of the rotor of an electric induction motor.

The invention also relates to the identification system that makes it possible to implement said method.

PRIOR ART

An electric motor is controlled by a variable speed drive, implementing a suitable control law. To correctly control the electric motor, the variable speed drive and its processing unit have to draw on certain parameters of the electric motor being controlled.

To ensure stable and efficient control, it is preferable for the variable speed drive to draw on parameters whose values are exact. This is the case in particular for the resistance of the rotor (also called 'rotor resistance') of the electric motor. Now, it turns out that this exact value of the resistance of the rotor is not necessarily known to the processing unit of the variable speed drive. The processing unit may then for example use a default value in the control operation, thereby very often bringing about impaired performance. Specifically, the rotor resistance may be overestimated or underestimated by the processing unit, bringing about a variation in the current in the stator and therefore an error in the implementation of the algorithm for calculating the voltages for the control law.

A number of solutions have however already been proposed for determining the resistance of the rotor. Some of these solutions consist in determining the rotor inductance in order to deduce the rotor resistance therefrom. However, without going into detail, on account of magnetic saturation, the value of the rotor inductance is not necessarily constant, thereby leading to an error in the determination of the rotor resistance.

Patent EP1713173B1 for its part describes a solution involving adjusting the parameters of an electric motor. It is implemented online, that is to say during normal operation of the motor. It consists primarily in using the integral term of the current loop to adjust the values of the parameters of the motor model.

This solution is also not satisfactory, in particular because it has to be implemented when a load is present on the motor and it requires the use of a speed sensor (closed loop).

The publication referenced "DIAB AHMED A ZAKI et Al, *"Parallel estimation of rotor resistance and speed for sensorless vector controlled induction motor drive"*—2016 17TH *International Conference of young specialists on Micro/nanotechnologies and electron devices (EDM), IEEE,* 30 Jun. 2016, pages 389-394, XP032943052, DOI: 10.1109/ EDM.2016.7538763" describes a method for identifying a resistance value of the rotor of an electric motor by using an adaptive system.

The aim of the invention is therefore to propose a new method for identifying the resistance of the rotor, which method is reliable, does not require the use of a speed sensor (closed loop) and is able to be implemented when a load is present or when a load is not present on the motor.

SUMMARY OF THE INVENTION

This aim is achieved by a method for identifying a resistance value of the rotor of an electric induction motor, said method including the following steps:

a) Determining a reference voltage on the basis of a chosen value for the resistance of the rotor of the electric motor,
b) Applying a control voltage to the electric motor, said control voltage being determined on the basis of said reference voltage,
c) Acquiring the values of the currents measured in the three phases of the electric motor, so as to deduce a stator current of the electric motor therefrom,
d) Comparing the obtained stator current with a predetermined value,
e) Correcting said value used for the resistance of the rotor and applying steps a) to d) until obtaining a stator current equal to said predetermined value.

This aim is also achieved by a method for identifying a resistance value of the rotor of an electric induction motor, said method including the following steps:

a) Determining a measurement voltage for which a stator current representative of the currents measured in the three phases of the electric motor is equal to a predetermined value,
b) Determining a reference voltage on the basis of a chosen value for the resistance of the rotor of the electric motor,
c) Comparing said reference voltage with the measurement voltage,
d) Correcting said value used for the resistance of the rotor and applying steps a) to c) until obtaining equality between said reference voltage and the measurement voltage.

According to one particular feature, said predetermined value corresponds to a value of zero or close to zero.

According to one particular embodiment, the method is implemented in accordance with a dichotomic principle comprising a plurality of successive iterations and in which, at each iteration, an interval in which the sought value for the resistance of the rotor is situated is divided by two.

According to another particular embodiment, the method is implemented in accordance with a gradient principle comprising a plurality of successive iterations and in which the chosen value for the resistance of the rotor is modified at each iteration depending on the meaning of the result of the comparison step.

The aim is also achieved by a system for identifying a resistance value of the rotor of an electric induction motor, which system includes:

a) A module for determining a reference voltage on the basis of a chosen value for the resistance of the rotor of the electric motor,
b) A module for applying control voltages to the electric motor, said control voltages being determined on the basis of said reference voltage,
c) A module for acquiring the values of the currents measured in the three phases of the electric motor, so as to deduce a stator current of the electric motor therefrom,
d) A module for comparing the obtained stator current with a predetermined value,
e) A module for correcting said value used for the resistance of the rotor and for executing modules a) to d) until obtaining a stator current equal to said predetermined value.

The aim is also achieved by a system for identifying a resistance value of the rotor of an electric induction motor, which system includes:

a) A module for determining a measurement voltage for which a stator current representative of the currents measured in the three phases of the electric motor is equal to a predetermined value, b) A module for determining a reference voltage on the basis of a chosen value for the resistance of the rotor of the electric motor, c) A module for comparing said reference voltage with the measurement voltage, d) A module for correcting said value used for the resistance of the rotor and applying steps a) to c) until obtaining equality between said reference voltage and the measurement voltage.

According to one particular feature, said predetermined value corresponds to a value of zero or close to zero.

According to one particular embodiment, this system is configured to operate in accordance with a dichotomic principle comprising a plurality of successive iterations and in which, at each iteration, an interval in which the sought value for the resistance of the rotor is situated is divided by two.

According to another particular embodiment, the system is configured to operate in accordance with a gradient principle comprising a plurality of successive iterations and in which the chosen value for the resistance of the rotor is modified at each iteration depending on the meaning of the result of the comparison step.

The invention relates lastly to a variable speed drive intended for the control of an electric motor, which variable speed drive includes a control system comprising an identification system in accordance with the one defined above.

BRIEF DESCRIPTION OF THE FIGURES

Other features and advantages will appear in the following detailed description, given with reference to the appended drawings, in which.

DETAILED DESCRIPTION OF AT LEAST ONE EMBODIMENT

The invention described hereinbelow applies to the control of an asynchronous (induction) motor M, preferably with a three-phase power supply. It is implemented in a conventional vectorial or scalar control scheme in open loop, that is to say without feedback of a speed measurement at the electric motor, or in closed loop, that is to say with feedback of a speed measurement at the electric motor.

The identification method of the invention is implemented in a control system that includes a processing unit UC. The processing unit UC includes at least a microprocessor and a memory. This control system is associated with a variable speed drive intended for the control of an electric motor. It may in particular be integrated into said variable speed drive.

In a known manner, the variable speed drive includes, as a general rule:

Input phases R, S, T that are connected to an electrical network supplying an AC voltage;

An AC/DC rectifier 10, such as for example a diode bridge, intended to transform the AC voltage supplied by the electrical network into a DC voltage;

A DC power supply bus connected at the output of the rectifier and including two power supply lines between which the DC voltage is applied;

At least one bus capacitor Cbus connected between the two power supply lines of the bus and intended to keep the DC voltage at a constant value;

A DC/AC inverter 11 connected to the DC power supply bus and comprising a plurality of power transistors, for example of IGBT type, controlled by the processing unit in such a way as to apply the required voltages to the output phases connected to the electric motor. The inverter 11 is controlled for example using traditional techniques of PWM (pulse-width modulation) or DTC (direct torque control) type. A control law executed by the processing unit UC makes it possible to determine the voltages to be applied to the output phases;

Output phases 1, 2, 3 that are intended to be connected to the electric motor M to be controlled.

In a nonlimiting manner, the invention will be described for a U/F scalar control law in open loop. It should be understood that the method described below will be identical regardless of the control law used.

Figure 1:
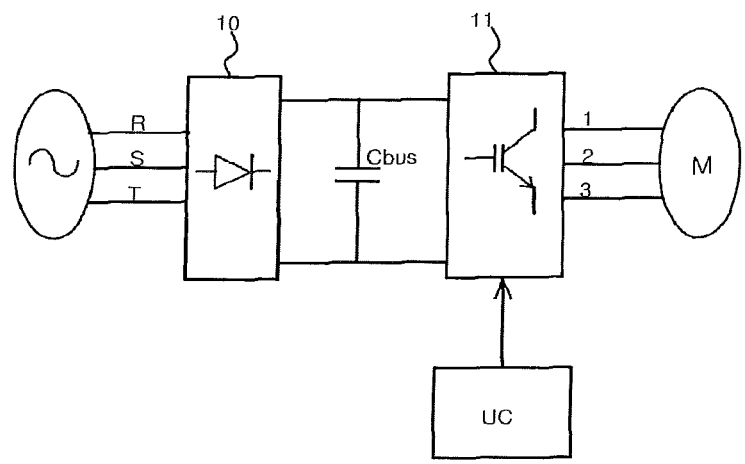
FIG. 1 shows the layout of a conventional variable speed drive including the control system of the invention.
Figure 2:
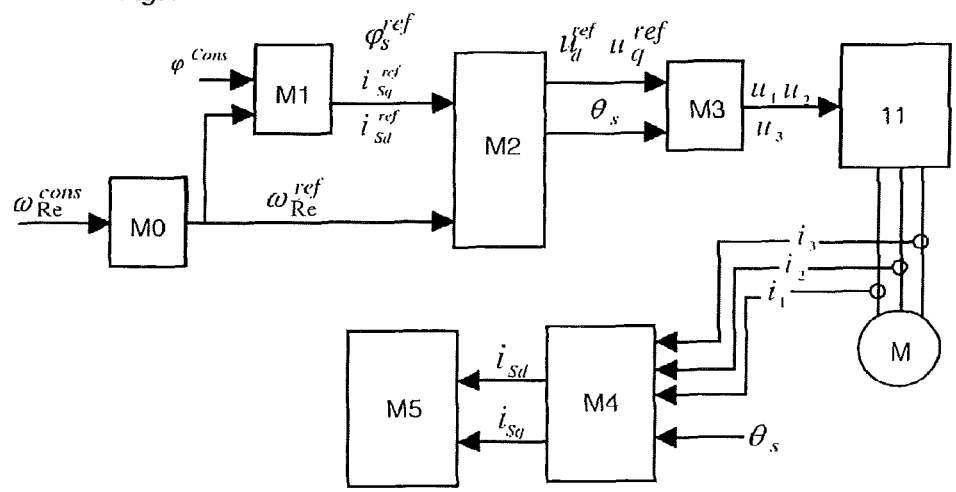
FIG. 2 shows an overview illustrating the operating principle of the control method of the invention.

In a known manner, with reference to FIG. 2, a conventional U/F scalar control law, executed by the processing unit in order to control an asynchronous electric motor in open loop, includes the following main features:

An angular velocity of the rotor of the electric motor setpoint $\omega^{cons}_{Re}$ and a flux setpoint $\varphi^{cons}$ are applied as input;

A module M0 determines a reference angular velocity of the rotor $\omega^{ref}_{Re}$ of the electric motor from the angular velocity of the rotor of the electric motor setpoint $\omega^{cons}_{Re}$ received as input;

A calculating module M1, receiving a flux setpoint $\varphi^{cons}$ and the reference angular velocity of the rotor $\omega^{Ref}_{Re}$ as input, determines the reference stator currents $i^{ref}_{Sd}$ and $i^{ref}_{Sq}$ and also the reference stator flux $\varphi^{ref}_{S}$;

A module M2, receiving the reference angular velocity of the rotor $\omega^{ref}_{Re}$, the reference stator flux $\varphi^{ref}_{S}$ and the reference currents $i^{ref}_{Sd}$ and $i^{ref}_{Sq}$ as input, determines the voltages $u^{ref}_{d}$ and $u^{ref}_{q}$ to be applied to the electric motor, and the angle of orientation $\theta_s$ to be applied;

A module M3 applies a Park transform in order to determine the voltages $u_1$, $u_2$, $u_3$ to be applied to the three output phases;

In the context of the invention, at least two of the three currents $i_1$, $i_2$, $i_3$ are measured on the three phases of the electric motor, for the purpose of the deduction of the currents $i_{Sd}$ and $i_{Sq}$ therefrom by a module M4 also receiving the angle of orientation $\theta_s$ as input.

Of course, other modules may be implemented by the processing unit, but these will not be detailed in the present application.

This control law is implemented during an operating phase, that is to say during normal operation of the electric motor M controlled by the variable speed drive.

The invention relates more particularly to a method for identifying the resistance of the rotor of the electric motor. This identification may be implemented prior to normal operation of the motor or at any other time during a phase of configuring the variable speed drive.

The identification method is implemented by an identification system, preferably executed by the processing unit UC of the variable speed drive. This identification system draws in particular on modules M1 to M4 of the control system and on an additional module M5 that assists in identifying the resistance of the rotor. The current and voltage measurement means will advantageously be integrated into the identification system of the invention, and the measurement steps that are implemented will advantageously form part of the identification method of the invention.

The identification method, in order to be implemented, draws on the following demonstrations, in which the index 'R' makes it possible to identify the parameters linked to the rotor, the index 'S' makes it possible to identify parameters linked to the stator, and the exponent 'ref' makes it possible to identify a reference parameter.

The reference stator voltage $u^{ref}_S$ is calculated using the formula:

$$u^{ref}_S = j \cdot \omega_S \cdot \varphi^{ref}_S + \frac{d}{dt} \varphi^{ref}_S \qquad (1)$$

in which, by construction, the reference stator voltage is written in complex form on the basis of the two d-axis and q-axis components, as follows:

$$u^{ref}_S = u^{ref}_d + j \cdot u^{ref}_q$$

The dynamic relationship with the rotor is given by the following equation:

$$\frac{d}{dt} \varphi^{ref}_R = -R_r \cdot i^{ref}_R \qquad (2)$$

We are seeking to create a voltage that cancels out the stator currents, i.e. $i^{ref}_{Sd}=0$ and $i^{ref}_{Sq}=0$.

In the same way as for the voltage, the stator currents are written in complex form as:

$$i^{ref}_S = i^{ref}_{Sd} - j \cdot i^{ref}_{Sq} = 0$$

The magnetic coupling of the motor gives the following relationships:

$$\begin{cases} \varphi^{ref}_S = \varphi^{ref}_M \\ \varphi^{ref}_R = L_{FR} \cdot i^{ref}_R + \varphi^{ref}_M \end{cases}$$

Where:

$$\varphi^{ref}_M = f(i^{ref}_R)$$

For example, the saturation function may be represented by the following function f:

$$f(i^{ref}_R) = L_{SAT} \cdot i^{ref}_R \cdot \frac{1}{1 + \gamma \cdot |i^{ref}_R|}$$

In which:
$\omega_S$ corresponds to the angular velocity of the voltage (derived from the angle of orientation $\theta_s$);

$\varphi^{ref}_M$ corresponds to the reference magnetizing flux, without loss of generality represented by an actual magnitude;

$\varphi^{ref}_R$ corresponds to the reference rotor flux, without loss of generality represented by an actual magnitude;

$i^{ref}_S$ corresponds to the reference stator current, equal to 0;

$i^{ref}_R$ corresponds to the reference rotor current, without loss of generality represented by an actual magnitude;

$R_r$ corresponds to the resistance of the rotor (or 'rotor resistance');

$L_{FR}$ corresponds to the rotor leakage inductance;

$L_{SAT}$ and $\gamma$ correspond to magnetic saturation parameters of the electric motor for the described function f.

By replacing $\varphi^{ref}_R$ with its expression, it becomes:

$$\frac{d}{dt} \varphi^{ref}_R = \left( L_{FR} + \frac{d\varphi^{ref}_M}{di^{ref}_R} \right) \cdot \frac{d}{dt} i^{ref}_R \qquad (3)$$

By calculating the derivative of the magnetic saturation function f, we obtain:

$$\frac{d\varphi^{ref}_M}{di^{ref}_R} = f'(i^{ref}_R) = L_{SAT} \cdot \frac{1}{\left(1 + \gamma \cdot i^{ref}_R\right)^2}.$$

The algorithm follows the steps described below.
The law of evolution of $i^{ref}_R$ is as follows, from equations (2) and (3):

$$\left( L_{FR} + L_{SAT} \cdot \frac{1}{\left(1 + \gamma \cdot i^{ref}_R\right)^2} \right) \cdot \frac{d}{dt} i^{ref}_R = -R_r \cdot i^{ref}_R$$

We are then able to calculate the magnetizing flux, which is also the stator flux:

$$\varphi^{ref}_M = f(i^{ref}_R) = L_{SAT} \cdot i^{ref}_R \cdot \frac{1}{1 + \gamma \cdot i^{ref}_R}$$

Ultimately, the voltage is calculated from the stator flux and its derivative:

$$\frac{d}{dt} \varphi^{ref}_S = f'(i^{ref}_R) \cdot \frac{d}{dt} i^{ref}_R$$

$$= -\frac{L_{SAT} \cdot \dfrac{1}{\left(1 + \gamma \cdot i^{ref}_R\right)^2}}{L_{FR} + L_{SAT} \cdot \dfrac{1}{\left(1 + \gamma \cdot i^{ref}_R\right)^2}} \cdot R_r \cdot i^{ref}_R,$$

$$\varphi^{ref}_S = f(i^{ref}_R) = L_{SAT} \cdot i^{ref}_R \cdot \frac{1}{1 + \gamma \cdot i^{ref}_R}$$

And the stator voltage has the value:

$$u^{ref}_S = j \cdot \omega_S \cdot \varphi^{ref}_S + \frac{d}{dt} \varphi^{ref}_S$$

It is deduced from the above relationships that there is a relationship between the resistance of the rotor and the reference stator voltage $u^{ref}_S$. It emerges from this that varying the resistance of the rotor will have an effect on the value of this voltage.

From the relationship:

$$u^{ref}_S = u^{ref}_d + j \cdot u^{ref}_q$$

We deduce therefrom that:

$$u^{ref}_d = \text{real part}(u^{ref}_S)$$

$$u^{ref}_q = \text{imaginary part}(u^{ref}_S)$$

Through rotation by an angle $\theta_s$, we obtain two voltages $u^{ref}_\alpha$, $u^{ref}_\beta$ in the fixed reference frame. To simplify the calculations, we introduce a third component $u^{ref}_\gamma$ equal to 0. This component represents the differences of the motor with respect to a balanced standard model. It only remains to apply the Clarke transform to calculate the voltages $u_1$, $u_2$, $u_3$:

$$\begin{pmatrix} u_1 \\ u_2 \\ u_3 \end{pmatrix} = \begin{pmatrix} 1 & 0 & \frac{\sqrt{2}}{2} \\ -\frac{1}{2} & \frac{\sqrt{3}}{2} & \frac{\sqrt{2}}{2} \\ -\frac{1}{2} & -\frac{\sqrt{3}}{2} & \frac{\sqrt{2}}{2} \end{pmatrix} \begin{pmatrix} u^{Ref}_\alpha \\ u^{Ref}_\beta \\ u^{Ref}_\gamma \end{pmatrix}$$

In a symmetrical manner, the measured currents $i_1$, $i_2$, $i_3$ may be transformed by the inverse Clarke transform:

$$\begin{pmatrix} i^{Ref}_\alpha \\ i^{Ref}_\beta \\ i^{Ref}_\gamma \end{pmatrix} = \frac{2}{3} \begin{pmatrix} 1 & -\frac{1}{2} & -\frac{1}{2} \\ 0 & \frac{\sqrt{3}}{2} & -\frac{\sqrt{3}}{2} \\ \frac{\sqrt{2}}{2} & \frac{\sqrt{2}}{2} & \frac{\sqrt{2}}{2} \end{pmatrix} \begin{pmatrix} i_1 \\ i_2 \\ i_3 \end{pmatrix}$$

Next, from the inverse rotation and the two voltage components $i_\alpha$, $i_\beta$, we obtain the two current values: $i_{Sd}$ and $i_{Sq}$. The current $i_S$ is calculated as a function of these values.

The general principle of the invention consists in putting in place an effective algorithm that makes it possible to converge towards the sought value of the resistance of the rotor $R_r$.

Figure 3A:
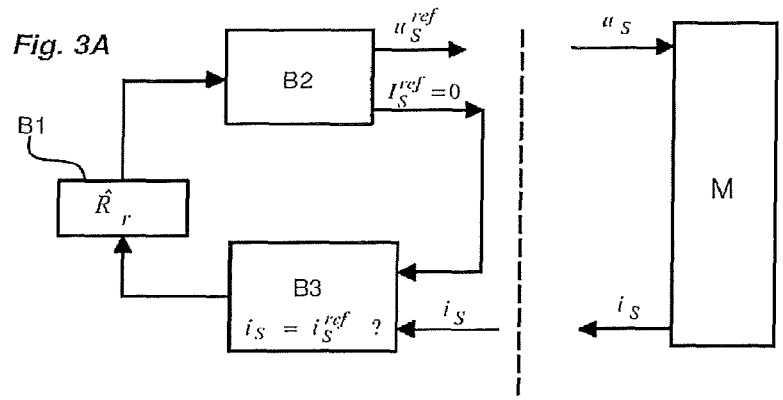
FIG. 3A is a first view of the principle of the identification method of the invention.
Figure 3B:
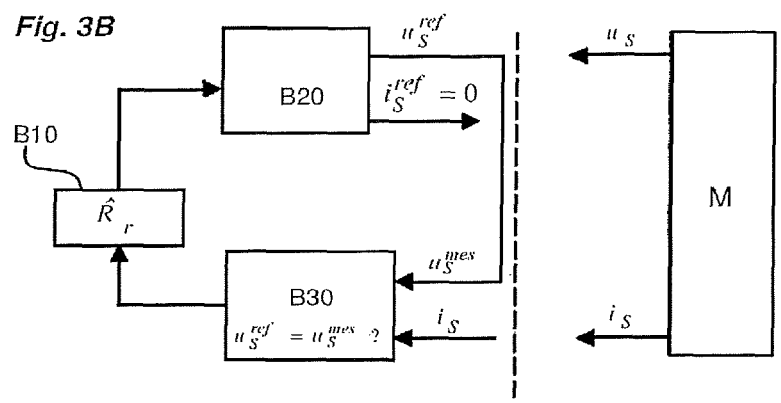
FIG. 3B is a second view of the principle of the identification method of the invention.

With reference to FIGS. 3A and 3B, two alternatives are then possible.

A first alternative, illustrated by FIG. 3A, consists in following the following cycle:
  Assigning, in a first block B1, a first theoretical value $\hat{R}_r$, as input for the control law (for example U/F as described above), to the resistance variable of the rotor;
  Determining, in a block B2, the reference stator voltage $u^{ref}_S$ from this first value $\hat{R}_r$ assigned to the resistance of the rotor;
  Applying, to the motor, the voltages (stator voltage $u_S$) calculated from the reference voltage $u^{ref}_S$;
  Measuring the currents $i_1$, $i_2$, $i_3$ in the three windings of the motor for the purpose of deducing a stator current $i_S$ therefrom;
  Comparing, in a block B3, the obtained stator current Is with a predetermined reference value (for example $i^{ref}_S = 0$);
  Restarting the above cycle with a new value for the resistance of the rotor as long as the predetermined value ($i^{ref}_S$) for the stator current has not been reached.

The three blocks B1, B2, B3 are in particular integrated into modules M1 to M5 of the control system described above.

Block B1 is for example executed in module M2 for calculating the control voltages.

Block B2 is for example executed in module M2 for calculating the voltages.

Block B3 is for example executed in module M5 for processing the stator current acquired during the measurements and deducing therefrom the new theoretical value $\hat{R}_r$ to be assigned to the resistance of the rotor depending on the chosen search solution (see below).

A second alternative, illustrated by FIG. 3B, consists in following the following cycle:
  Acquiring, through measurement, a measurement voltage referenced $u^{mes}_S$ for which the stator current Is is equal to the predetermined reference value, that is to say for example $i_S = 0$;
  Assigning, in a first block B10, a first theoretical value $\hat{R}_r$, as input for the control law (for example as described above), to the resistance variable of the rotor;
  Determining, in a block B20, the reference stator voltage $u^{ref}_S$ from this first theoretical value $\hat{R}_r$ assigned to the resistance of the rotor;
  Comparing, in a block B30, the reference stator voltage $u^{ref}_S$ with the measured voltage Or acquired initially;
  Restarting the above cycle with a new value for the resistance of the rotor as long as the two voltages are not equal. The new theoretical value $\hat{R}_r$ assigned to the rotor resistance is determined on the basis of the result of the comparison between the two voltages.

The initial acquisition of the voltage $u^{mes}_S$ is able to be achieved in accordance with two separate principles:
  By putting the motor into freewheeling mode, that is to say that the voltage applied to the motor is not controlled;
  By regulating the stator current to a value of zero, the voltage applied to the motor is then calculated by a control loop acting on the currents.

In theory, the predetermined stator current $i_S$ value $i^{ref}_S$ to be obtained, which corresponds to the exact value of the resistance of the rotor $R_r$, is close to zero, preferably equal to zero. In other words, when the resistance of the rotor is at its exact value, the stator current $i_S$ obtained when implementing the solution of the invention is at this value close to zero, typically the nominal current divided by 50, preferably zero.

To optimize the search for the exact value of the resistance of the rotor $R_r$, a plurality of algorithms may be put in place in order to converge towards an accurate value of the rotor resistance $R_r$. In a nonlimiting manner:
  A first solution consists in using a dichotomic principle.
  A second solution consists in putting in place what is termed a gradient method.

In the first solution, using a dichotomic principle, the parameters used are RMAX, RMIN, which correspond to the extreme bounds of each interval within which the value of the rotor resistance is sought and a number N of iterations. As a principle, at each new iteration (that is to say at each new cycle starting with the assignment of a new value $\hat{R}_r$ to the rotor resistance), the width of the interval of the possible values to be assigned to the rotor resistance is divided by two. When the number of iterations is reached, the value of the rotor resistance is situated in the last interval that is explored. The narrower this interval is, the more accurate the value will be. The principle is illustrated more precisely in FIG. 4.

These two search solutions may apply to the two alternatives described above, with only the constraint for stopping the search being different (equation $i^{ref}_S$ for the first alternative and equation $u^{ref}_S = u^{mes}_S$).

Figure 4:
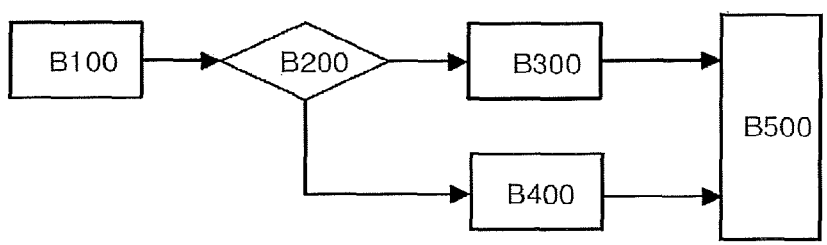
FIG. 4 illustrates the principle of dichotomic seeking of the value of the rotor resistance.

By way of example and nonlimitingly, with reference to FIG. 4, for the first alternative described above in connection with FIG. 3A, the dichotomic search algorithm includes the various following blocks:

The parameters RMAX, RMIN, whose values are initialized at determined values so as to define a search interval, are defined; R0 is also chosen to have a value contained within the interval RMAX and RMIN;

Block B100 is a processing block that corresponds to block B3 described above in the overall search process. It is in this block that it is determined whether or not the search is continued, on the basis of the comparison between the value of the stator current $i_S$ and the value $i^{ref}_S$;

Block B200 corresponds to a test block for testing whether the value of the current $i_S$ is greater than zero;

If the current $i_S$ is greater than zero, block B300 consists in replacing the value of RMAX with R0; R0= (RMAX+RMIN)/2

If the current $i_S$ is less than zero, block B400 consists in replacing the value of RMIN with R0; R0=(RMAX+RMIN)/2

Block B500 corresponds to an end block of an iteration, before a new iteration with the new value assigned to R0.

Figure 5:
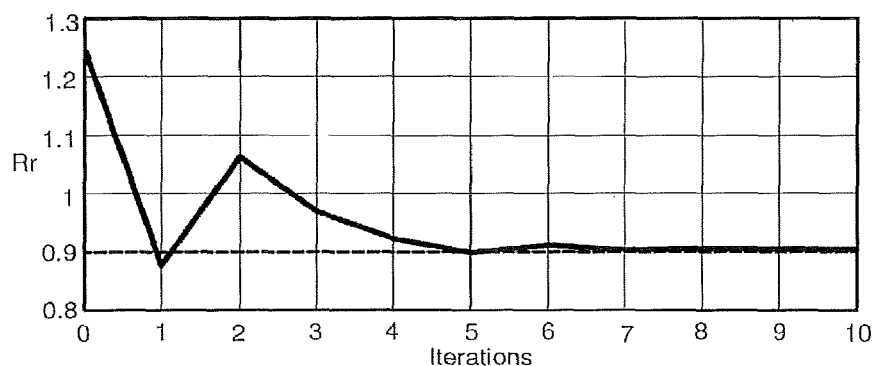
FIG. 5 illustrates, according to one particular embodiment, the operating principle of the identification method of the invention.

FIG. 5 thus illustrates the principle of the identification method of the invention, using a dichotomic search. The number of iterations is shown on the abscissa and the value assigned to the rotor resistance $R_r$ updated after each iteration is shown on the ordinate. It is possible to see a convergence towards an accurate value of the rotor resistance R, after five iterations.

The second search solution outlined above consists in varying the value assigned to the rotor resistance R, upwards or downwards on the basis of the variation in the stator current Is obtained at each new iteration. With this method being able to be understood easily, it is not detailed in the present application.

It is understood from the above that the solution of the invention for identifying the resistance of the rotor of an electric motor has a certain number of advantages, including:

A certain simplicity, since the method is integrated easily into the control law for the electric motor;

The method is able to be executed just once during the phase of configuring the variable speed drive with its electric motor;

The solution does not require the use of a speed sensor on the electric motor and is therefore able to operate in open loop.

The invention claimed is:

1. A method for identifying a resistance value ($R_r$) of a rotor of an electric induction motor (M), said method comprising the following steps:
   a) determining a reference voltage ($u^{ref}_S$) on the basis of a chosen value ($\hat{R}_r$) for a resistance of the rotor of the electric motor,
   b) applying a control voltage ($u_S$) to the electric motor, said control voltage being determined on the basis of said reference voltage ($u^{ref}_S$),
   c) acquiring values of currents ($i_1$, $i_2$, $i_3$) measured in three phases of the electric motor, so as to deduce a stator current (Is) of the electric motor therefrom,
   d) comparing the stator current ($i_S$) with a predetermined value ($i^{ref}_S$),
   e) correcting said chosen value ($\hat{R}_r$) used for the resistance ($R_r$) of the rotor and applying steps a) to d) until obtaining a stator current ($i_S$) equal to said predetermined value.

2. The method according to claim 1, wherein said predetermined value ($i^{ref}_S$) corresponds to a value of zero or close to zero.

3. The method according to claim 2, wherein it is implemented in accordance with a dichotomic principle comprising a plurality of successive iterations and wherein, at each iteration, an interval in which a sought value for the resistance of the rotor is situated is divided by two.

4. The method according to claim 2, wherein it is implemented in accordance with a gradient principle comprising a plurality of successive iterations and wherein the chosen value ($\hat{R}_r$) for the resistance of the rotor is modified at each iteration depending on the meaning of the result of the comparison step.

5. A system for identifying a resistance value ($R_r$) of a rotor of an electric induction motor (M), comprising:
   a) a module for determining a reference voltage ($u^{ref}_S$) on the basis of a chosen value ($\hat{R}_r$) for a resistance of the rotor of the electric motor,
   b) a module for applying control voltages ($u_S$) to the electric motor, said control voltages being determined on the basis of said reference voltage ($u^{ref}_S$),
   c) a module for acquiring values of currents ($i_1$, $i_2$, $i_3$) measured in three phases of the electric motor, so as to deduce a stator current ($i_S$) of the electric motor therefrom,
   d) a module for comparing the stator current ($i_S$) with a predetermined value ($i^{ref}_S$),
   e) a module for correcting said chosen value ($\hat{R}_r$) used for the resistance ($R_r$) of the rotor and for executing modules a) to d) until obtaining a stator current equal to said predetermined value ($i^{ref}_S$).

6. The system according to claim 5, wherein said predetermined value corresponds to a value of zero or close to zero.

7. The system according to claim 6, wherein said system is configured to operate in accordance with a dichotomic principle comprising a plurality of successive iterations and wherein, at each iteration, an interval in which a sought value for the resistance of the rotor is situated is divided by two.

8. The system according to claim 6, wherein said system is configured to operate in accordance with a gradient principle comprising a plurality of successive iterations and wherein the chosen value ($\hat{R}_r$) for the resistance of the rotor is modified at each iteration depending on the meaning of the result of the comparison step.

9. A variable speed drive intended for control of an electric motor, wherein a control system comprises an identification system in accordance with the one defined in claim 5.

* * * * *